United States Patent [19]

Elsdoerfer

[11] Patent Number: 4,855,734
[45] Date of Patent: Aug. 8, 1989

[54] RELATIVE POSITION INDICATION SYSTEM

[75] Inventor: Norbert W. Elsdoerfer, Warwick, R.I.

[73] Assignee: International Machine & Tool Corporation, Warwick, R.I.

[21] Appl. No.: 175,488

[22] Filed: Mar. 29, 1988

[51] Int. Cl.$^4$ .............................................. G08C 19/16
[52] U.S. Cl. ...................... 340/870.310; 340/870.350; 324/208; 318/661; 341/156
[58] Field of Search .................. 340/870.310, 870.320, 340/870.350, 870.360; 324/207, 208; 318/638, 650, 660, 661; 341/155, 156

[56] References Cited

U.S. PATENT DOCUMENTS

| | | | |
|---|---|---|---|
| 4,358,723 | 11/1982 | Scholl | 318/661 |
| 4,712,106 | 12/1987 | McNally | 340/870.320 |
| 4,764,767 | 8/1988 | Ichikawa et al. | 340/870.31 |

Primary Examiner—Donald J. Yusko
Assistant Examiner—Tyrone Queen
Attorney, Agent, or Firm—Salter & Michaelson

[57] ABSTRACT

A relative position indication system comprises a cyclical position sensor which includes first and second plates having cyclical windings thereon. The position indication system is operative for determining the relative cycle position between the windings on the first plate and the windings on the second plate within a single cycle and for determining a cycle count representing the number of whole cycles by which the first and second plates have been repositioned relative to each other. The position indication system is further operative for combining the relative cycle positions with the cycle count in order to determine the overall relative position of the plates, and it is operative for updating the cycle count without updating the relative cycle position each time the plates are aligned in a zero or initialized position.

16 Claims, 3 Drawing Sheets

RELATIVE POSITION INDICATION SYSTEM

BACKGROUND AND SUMMARY OF THE INVENTION

The instant invention relates to relative position indication systems and more particularly to a position indication system which is operative with extremely high levels of accuracy and reliability for determining the relative positions between a pair of first and second members.

Relative position indication systems have generally been found to be essential to the effective operation of many types of devices, such as certain precision machine tools. For example, it has been found that it can often be extremely important to know the precise orientation and position of a workpiece relative to a tool holding system, as the position of the workpiece is changed relative to the tool holding system along either a linear or a rotational path while a machining operation is performed on the workpiece. However, while several types of both induction and optical position indication systems have been heretofore available for applications of this type, they have generally been found to be either unreliable or very costly.

The heretofore available induction position indication systems have generally comprised induction resolvers comprising pairs of aligned spaced plates having uniform rotary or linear cyclical precision windings thereon. A resolver of this type is generally operative by passing an alternating current flow through the windings on one of the plates thereof in order to induce a voltage in the windings on the other plate which is precisely related to the relative positions of the cyclical windings on the two plates. It has been found that it is possible to precisely determine the relative positions of the two plates of a device of this type within a single cycle, and it has been further found that by counting the number of cycles passing by a zero or initialized position on one of the plates as the relative positions of the plates are changed, it is possible to determine the overall relative positions of the two plates along a predetermined path of movement at any given instant. However, it has also been found that signal noise, interference, and/or momentary power interruptions can produce errors in the cycle count of a device of this type and that, as a result, while it is possible to reliably and accurately determine the relative positions of the plates of a device of this type within a single cycle, it is not always possible to reliably determine the overall relative positions of the plates based on a cycle count. In order to overcome this problem, some of the heretofore available induction resolvers have included initialization or reset signal generators for resetting the relative positions of the plates thereof to zero or initialized values whenever the plates thereof are moved through zero or initialized positions. However, these devices have been operative for resetting the overall relative positions between the plates thereof; and, as a result, they have often introduced fractional position errors. Other induction resolvers have included additional enlarged single cycle windings for determining the overall relative positions between the plates thereof. However, while these devices have generally been found to be effective, they have also been found to be relatively expensive.

The heretofore available optical position indication systems have generally comprised optical encoders of a type comprising a glass plate having a predetermined pattern of markings thereon, a light source and a light sensor which is operative for sensing the light from the light source as it is passed through the glass plate in order to determine the position of the glass plate. However, devices of this type have generally been found to be less accurate than induction resolvers, and they have generally been found to operate more slowly than induction resolvers.

The instant invention provides an effective position indication system which overcomes the disadvantages of many of the heretofore available position indication systems. Specifically, the instant invention provides a position indication system which is operative for determining the relative positions of a pair of first and second members as the first member is moved in either a positive or a negative direction along a predetermined path of movement relative to the second member. More specifically, the system of the instant invention comprises a cyclical position sensor including a first portion which is securable in effectively fixed relation to a first member and a second portion which is securable in effectively fixed relation to a second member. The first portion includes means defining a predetermined number of sequential cycles thereon, one of which is designated as a zero cycle, and each of the cycles on the first portion is uniformly divided into a plurality of cycle segments. The second portion of the position sensor preferably also includes means defining a predetermined number of sequential cycles thereon, one of which corresponds to a zero position station, and the system is constructed so that sequential cycles on the first portion sequentially pass by the zero position station when the first portion is moved along a predetermined path of movement relative to the second portion. The system further comprises means responsive to the cycles on the first portion for determining the relative positions of the first and second portions within the cycle located at the zero position station at any given time and summing means for determining the sum total of the number of cycles passing by the zero position station in a positive direction minus the number of cycles passing by the zero position station in a negative direction. The system further comprises pulse generating means which is mounted in effectively fixed relation with either the first portion of the sensor or the second portion of the sensor and operative for generating pulse signals which indicate movement of the zero cycle past the zero position station and pulse sensing means which is mounted in effectively fixed relation with the other one of the first or second portions of the sensor and which is operative for sensing the pulse signals generated by the pulse generating means. The system still further comprises means responsive to the pulse sensing means for resetting the summing means to an initialized value without resetting the cycle positioning means each time the zero cycle passes by the zero position station.

In the preferred embodiment of the system of the instant invention, the cyclical position sensor comprises an induction resolver, and the first and second portions each have a predetermined number of cyclical precision windings thereon. The pulse generating means preferably comprises a pulse generator, and the pulse sensing means preferably comprises a pulse receiver. The pulse generator and the pulse receiver are preferably mounted in fixed positions relative to either the first portion of the position sensor or the second portion of the position sensor, and the pulse generating means preferably further comprises a selective interference plate which is mounted in a fixed position relative to the other one of the first or second portions of the cyclical position sensor. The interference plate is operative for selectively interfering between the pulse generator and the pulse receiver in order to selectively transmit pulse signals to the pulse receiver which correspond only to the zero cycle location. Further, the pulse generator is preferably operative for only producing a single pulse signal each time a cycle passes by the zero position station, and all of the pulse signals are preferably timed to occur at the same relative positions in the respective cycles thereof. Still further, each of the pulse signals preferably has a duration which causes it to extend over a distance corresponding to less than one cycle width as the first portion is moved relative to the second portion, and each pulse signal is preferably positioned to occur entirely within a single cycle.

Accordingly, it is seen that the position indication system of the instant invention represents a significant improvement over the heretofore available position indication systems. Specifically, the position indication system of the instant invention is operative for initializing or resetting the cycle count to zero each time the zero cycle passes by the zero position station so that cycle count errors resulting from interference, signal noise, and/or power interruptions, etc., are eliminated each time the zero cycle passes by the zero position station. However, since the system is operative for resetting only the cycle count rather than the overall relative position reading between the first and second portions of the position sensor, errors are not introduced into the relative positions of the first and second portions within a specific cycle. As a result, the system of the instant invention is operative for accurately determining the relative positions between a pair of first and second members within a single cycle, and it is also operative for accurately determining an overall cycle count.

Accordingly, it is a primary object of the instant invention to provide an effective and accurate relative position indication system.

Another object of the instant invention is to provide an induction resolver position indication system wherein the overall cycle count is updated each time the system passes through a predetermined zero orientation.

An even further object of the instant invention is to provide an induction resolver position indication system wherein the overall cycle count is updated without altering the relative position within a cycle each time the system passes through a predetermined zero orientation.

Other objects, features and advantages of the invention shall become apparent as the description thereof proceeds when considered in connection with the accompanying illustrative drawings.

DESCRIPTION OF THE DRAWINGS

In the drawings which illustrate the best mode presently contemplated for carrying out the present invention.

DESCRIPTION OF THE INVENTION

Figure 2:
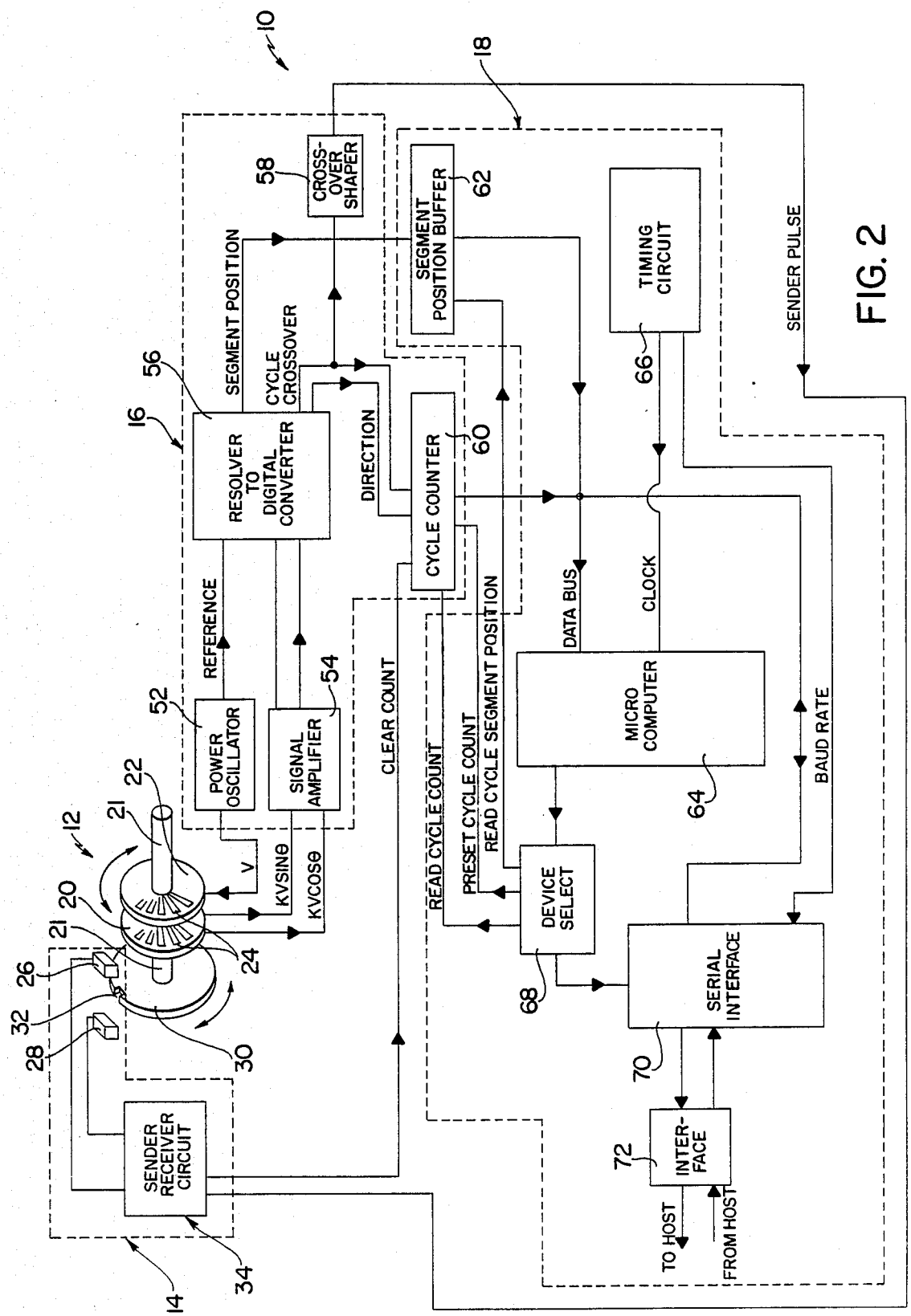
FIG. 2 is a schematic block diagram illustrating the operation of the system of the instant invention.

Referring now to the drawings, the relative position indication system of the instant invention is illustrated in FIG. 2 and generally indicated at 10. The system 10 comprises a cyclical position sensor generally indicated at 12, a pulse assembly generally indicated at 14, a cycle conversion circuit generally indicated at 16, and a signal processing circuit generally indicated at 18, all of which are powered by a conventional power supply (not shown). The cyclical position sensor 12 as herein embodied comprises a cyclical induction rotary resolver including a stator 20 which is mounted in a fixed position and rotatably received on a rotatable shaft 21, and a rotor 22 which is mounted in fixed relation on the shaft 21 so that it rotates therewith. In this connection, however, it will be understood that other embodiments of the system of the instant invention which include linear induction resolvers or even optical position sensors, such as encoders, are also contemplated. The stator 20 and the rotor 22 are each formed with a series of cyclical precision windings 24 thereon, and the position sensor 12 is operative for producing signals which correspond to the relative positions between the cyclical windings 24 on the stator 20 and the cyclical windings 24 on the rotor 22. The pulse assembly 14 is operative for producing an electronic pulse signal each time the rotor 22 is rotated by an amount corresponding to a complete cycle and for sensing only those electronic pulse signals which are produced when the rotor 22 is in a predetermined aligned position relative to the stator 20. The pulse assembly 14 is further operative for producing a CLEAR COUNT signal whenever a pulse signal is sensed. The cycle conversion circuit 16 and the signal processing circuit 18 are operative for processing the signals from the cyclical position sensor 12 and the pulse assembly 14 in order to accurately determine the rotational position of the rotor 22 relative to the stator 20.

The cyclical position sensor 12 comprises a conventional induction position sensor of the general type disclosed in the U.S. Pat. Nos. to Farrand 3,090,934 and 3,202,948. In the embodiment herein set forth, the cyclical position sensor 12 comprises a multispeed rotary induction resolver of the type manufactured by Farrand Industries, Inc. of Valhalla, N.Y., as an "Inductosyn" (Farrand Industries, Inc. T.M.) resolver. The stator 20 and the rotor 22 each include a plurality of substantially radially disposed precision windings 24 which define uniform cycles thereon. In this connection, the windings 24 on the stator 20 preferably define 360 cycles, and the windings 24 on the rotor 22 preferably also define 360 cycles, and the cycles on the stator 20 and the cycles on rotor 22 are uniformly spaced around their respective axes. The position sensor 12 is operative by applying a carrier frequency V to the rotor 22 in order to generate induced voltage signals which are proportional to the relative position between the cycles on the stator 20 and the cycles on the rotor 22 at any given time. Specifically, the position sensor 12 is operative for producing signals equal to $KV \sin \theta$ and $KV \cos \theta$ where $\theta$ represents the relative angle between the cycles on the stator 20 and the adjacent cycles on the rotor 22, and K represents a voltage transformation ratio.

Accordingly, the relative position between the cycles on the stator 20 and the cycles on the rotor 22 can be accurately determined at any time.

Figure 3:
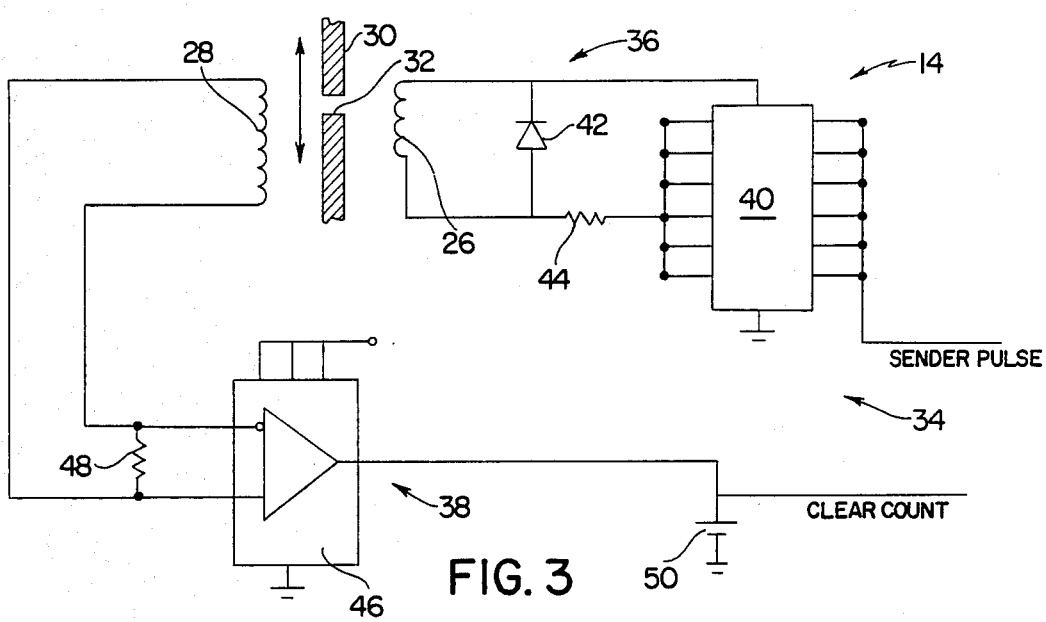
FIG. 3 is a schematic diagram of the sender-receiver circuit of the system.

The pulse receiver assembly 14 is illustrated in FIGS. 2 and 3, and it comprises a pulse transmitter 26, a pulse receiver 28, an interference plate 30 having a window 32 therein, and a sender-receiver circuit 34. The interference plate 30 preferably comprises a substantially flat circular plate, and it is nonrotatably mounted on the shaft 21 for rotation with the rotor 22. The window 32 is formed in the periphery of the plate 30, and it has a width which is approximately equal to the width of one cycle on the rotor 22, i.e., it has a width of approximately 1° of rotation. The transmitter 26 and the receiver 28 comprise coupled coils which are disposed in aligned orientation and operative for transmitting and receiving pulse signals through the window 32 when the window 32 is aligned with the transmitter 26 and the receiver 28. In this connection, the aligned position of the window 32 relative to the transmitter 26 and the receiver 28 corresponds to a predetermined zero cycle position of the rotor 22 wherein a reference or zero cycle on the rotor 22 is aligned with a predetermined reference or zero position station on the stator 20. Accordingly, the receiver 28 is operative for receiving signals which indicate that the stator 20 and the rotor 22 are in a predetermined orientation which corresponds (preferably directly) to an initialized position wherein the zero cycle on the rotor 22 is aligned with the zero position station on the stator 20. The sender-receiver circuit 34 is operative for energizing the transmitter 26 and for sending a signal to the cycle conversion circuit 16 which indicates that the zero cycle on the rotor 22 is aligned with the zero position station on the stator 20.

The sender-receiver circuit 34 is illustrated in FIG. 3, and it comprises a transmitter section 36 which is responsive to SENDER PULSE signals from the segment conversion circuit 16 for energizing the transmitter 26 to generate pulse signals and a receiver section 38 which is operative for processing the signals received by the receiver 28. The transmitter section 36 comprises a microcircuit 40, a diode 42, and a resistor 44. The microcircuit 40 comprises a hex inverter which is operative as a high current gain amplifier The diode 42 is connected in parallel with the transmitter 26, and the microcircuit 40 is connected in parallel with the diode 42 and the transmitter 26 through the resistor 44. Accordingly, the diode 42 is operative as a "snubber" for protecting the microcircuit 40 against reverse voltages, and the resistor 44 is operative as a current limiting device for protecting the transmitter section 36 against overloading. The receiver section 38 comprises a microcircuit 46, a resistor 48, and a capacitor 50. The microcircuit 46 comprises a differential line receiver, and it has a threshold voltage of ±25 mV for "full turn on". The microcircuit 46 is connected in parallel to the receiver 28, and the resistor 48 is connected in parallel with the microcircuit 46 for line matching in order to reduce stray capacitance and unwanted noise in the receiver section 38. The capacitor 50 is connected to the output from the microcircuit 46 as a filter for frequency shaping the output signal from the microcircuit 46.

The cycle conversion circuit 16 is illustrated in FIG. 2 and comprises a power oscillator 52, a signal amplifier 54, a resolver to digital converter 56, a crossover shaper 58, and a cycle counter 60. The power oscillator 52 preferably comprises a conventional model OSC 1754/500 "Inductosyn" (Farrand Industries, Inc. T.M.) power oscillator, and it is operative for producing a crossover frequency signal V in order to energize the windings 24 on the rotor 22. The power oscillator 52 is further operative for producing a reference signal for the resolver to digital converter 56 which is identical to the carrier frequency signal V. The signal amplifier 54 preferably comprises a conventional model #IPA 1751/560 "Inductosyn" (Farrand Industries, Inc. T.M.) pre-amplifier, and it is operative for amplifying the KV SIN $\theta$ and KV COS $\theta$ signals from the stator 20 in order to provide the necessary signal amplitude required by the resolver to digital converter 56. The resolver to digital converter 56 preferably comprises a conventional model #IRD 1730/560 "Inductosyn" (Farrand Industries, Inc. T.M.) resolver to digital converter, and it is operative for converting the KV SIN $\theta$ and KV COS $\theta$ signals from the stator 20 into digital signals which represent specific relative angular positions between the cycles on the stator 20 and the cycles on the rotor 22. In this regard, the resolver to digital converter 56 is operative for dividing each cycle on the stator 20 and each cycle on the rotor 22 into 4,096 segments, each of which represents a specific natural binary position, and as a result, the resolver to digital converter 56 is operative with an extremely high level of resolution for determining the relative positions between the cycles on the stator 20 and the cycles on the rotor 22. The resolver to digital converter 56 is operative for producing SEGMENT POSITION signals which represent the relative binary segment positions between the cycles on the stator 20 and the cycles on the rotor 22, and these signals are fed to the signal processing circuit 18. The resolver to digital converter 56 is further operative for sending a CYCLE CROSSOVER signal to the cycle counter 60 each time the cycles on the rotor 22 cross over or become aligned with new cycles on the stator 20. Still further, the resolver to digital converter 56 is operative for sending a DIRECTION signal to the cycle counter 60 which indicates the direction of rotation of the rotor 22. The crossover shaper 58 also receives the CYCLE CROSSOVER signals from the resolver to digital converter 56, and it is operative for generating narrow pulse signals of a fixed width in response thereto. Specifically, the crossover shaper 58 preferably comprises a 74LS123N device manufactured by Texas Instruments of Dallas, Tex., and it is set up as a monostable, multivibrator, or "oneshot" which triggers on each rising edge of the CYCLE CROSSOVER signal from the resolver to digital converter 56 for producing a SENDER PULSE signal. The SENDER PULSE signal from the crossover shaper 58 is fed to the sender-receiver circuit 34 for actuating the sender-receiver circuit 34 in order to operate the transmitter 26. In this connection, the crossover shaper 58 is preferably adapted so that the pulses in the SENDER PULSE signal have durations and intensities which are insufficient to cause the transmitter 26 and the receiver 28 to operate in a saturated condition. Specifically, the SENDER PULSES from the crossover shaper 58 preferably have durations of approximately 100 nanoseconds in order to prevent operating the receiver 28 in a saturated condition. The cycle counter 60 preferably comprises a pair of 74ALS569NAN eight bit synchronous up/down counters, and it is operative for determining a sum total representing the number of CYCLE CROSSOVER signals produced as the rotor 22 is rotated in a clockwise direction minus the number of CYCLE CROSSOVER signals produced while the rotor 22 is rotated in a counterclockwise direction. The cycle counter 60 is further operative for receiving the CLEAR COUNT signals from the receiver portion 38 of the sender-receiver circuit 34 and for initializing or clearing the sum total of the CYCLE CROSSOVER signals each time a CLEAR COUNT signal is received from the sender-receiver circuit 34. Accordingly, the cycle counter 60 is cleared or initialized each time the zero cycle on the rotor 22 is aligned with the zero position station on the stator 20. The 74ALS569NAN counters in the cycle counter 60 are adapted to include buffer functions to enable them to selectively feed data to the data processor circuit 18 on command.

The signal processing circuit 18 is operative for reading data from the cycle conversion circuit 16 and for converting the data to a format which is compatible with a host computer. The signal processing circuit 18 comprises a segment position buffer 62, a microcomputer 64, a timing circuit 66, a device-select 68, a serial interface 70, and an interface 72. The segment position buffer 62 comprises a pair of 74ALS373N octal latches with three-state outputs, and it is operative in a conventional manner for selectively feeding the segment position signals from the resolver to digital converter 56 to a DATA BUS of the microcomputer 64. The microcomputer 64 preferably comprises a model D8748H microcomputer made by Intel Corporation, and it is operative for receiving and assimilating data from the cycle counter 60 and the segment position buffer 62 and for converting the assimilated data to ASCII seven bit code format so that it can be effectively transmitted to the host computer. The timing circuit 66 comprises a pair of 74LS393N dual four bit binary counters and a 4.9152 MHz oscillator. The timing circuit 66 is operative in a conventional manner for producing a CLOCK pulse signal for the microcomputer 64, and a selectable BAUD RATE signal (16 times) for use by the serial interface 70. The device-select 68 is operative for effecting selective communication between the microcomputer 64 and the serial interface 70, the cycle counter 60, and the segment position buffer 62, and it comprises a 74LS02N quad NOR gate and a 74NLS138N 3 to 8 decoder. The device-select 68 is controlled by the microcomputer 64 for enabling the microcomputer 64 to select data from the serial interface 70, the cycle counter 60, or the segment position buffer 62 in a conventional manner. Specifically, the device select 68 is actuatable for sending a READ CYCLE COUNT signal to the cycle counter 60 in order to enable the microcomputer 64 to read the cycle count, and the device select 68 is further actuatable for producing a PRESET CYCLE COUNT signal in order to preset the initialized cycle count at a predetermined value (normally zero). The device select 68 is further actuatable for sending a READ CYCLE SEGMENT POSITION signal to the segment position buffer 62 in order to enable the microcomputer 64 to read the segment position. The serial interface 70 comprises an IM6402-1 universal asynchronous receiver-transmitter (UART). The serial interface 70 is operative for sending parallel format data to the microcomputer 64 and for encoding the parallel format data from the microcomputer 64 into serial format. The serial interface 70 is further operative for decoding serial format data from a host computer into parallel format so that the data can then be fed to the DATA BUS of the microcomputer 64. The interface 72 comprises an RS232C interface which includes a conventional MAX232CPE integrated circuit, and it is operative for transmitting signals to a host computer and for receiving signals back from the host computer.

Accordingly, during operation of the system 10, the rotor 22 is energized by the power oscillator 52 so that the stator 20 is operative for producing KV SIN $\theta$ and KV COS $\theta$ signals which are fed to the signal amplifier 54. The signals from the signal amplifier 54 are fed to the resolver to digital converter 56 which is operative in response thereto for producing a digital segment position signal which represents the specific segment located at the zero position station within the cycle located at the zero position station at any given time. The resolver to digital converter 56 is also operative for producing a CYCLE CROSSOVER signal each time the relative positions of the cycles on the rotor 22 have been reoriented with respect to the cycles on the stator 20 by a whole cycle. The resolver to digital converter 56 is further operative for producing a DIRECTION signal which is indicative of the direction of rotation of the rotor 22. The cycle counter 60 is operative for receiving the CYCLE CROSSOVER signals and the DIRECTION signals from the resolver to digital converter 56, and for producing a sum total signal representing the number of CYCLE CROSSOVER signals produced while the rotor is rotated in a clockwise direction minus the number of CYCLE CROSSOVER signals produced while the rotor 22 is rotated in a counterclockwise direction. The CYCLE CROSSOVER signals from the resolver to digital converter 56 are also fed to the crossover shaper 58, and the crossover shaper 58 is operative in response thereto for generating shaped SENDER PULSES of very short duration. The SENDER PULSES from the crossover shaper 58 are fed to the sender-receiver circuit 34, and the sender-receiver circuit 34 is operative for actuating the transmitter 26 to produce a very short pulse each time a cycle crossover occurs. In this regard, when the window 32 is aligned with the transmitter 26 and the receiver 28, the signal produced by the transmitter 26 is received by the receiver 28, and the sender-receiver circuit 34 is operative for sending a CLEAR COUNT signal to the cycle counter 60 in order to initialize or reset the cycle counter 60 to a zero value or some other predetermined initialized value. In this connection, the SENDER PULSES emitted by the crossover shaper 58 are of sufficiently short duration to prevent saturation of the receiver 28 in order to enable the pulses from the transmitter 26 to be more effectively and accurately detected by the receiver 28. The SENDER PULSES emitted by the crossover shaper 58 preferably have durations which cause them to extend over less than the width of one cycle segment, i.e., less than (1/4096th) of a cycle. The window 32, on the other hand, preferably extends over an entire cycle width. Accordingly, precise orientation of the window 32 is relatively unimportant since the pulses emitted by the transmitter 26 are of sufficiently short duration that they are always on for a period of time which is far less than the time it takes for the rotor 22 to be reoriented relative to the stator 20 by an entire cycle width. As a result, each of the pulses emitted by the transmitter 26 always occurs entirely within a single cycle in order to avoid cycle count errors. In any event, the microcomputer 64 is operative for receiving the CYCLE COUNT signals from the cycle counter 60 and the SEGMENT POSITION signals from the resolver to digital converter 56 through the segment position buffer 62 and for assimilating the two signals in order to provide an indication of the overall relative position between the rotor 22 and the stator 20. In other words, the microcomputer 64 is operative for receiving data from the segment position buffer 62 which represents the relative position between the cycles on the rotor 22 the cycles on the stator 20 within a single cycle, and for combining this data with the cycle count data from the cycle counter 60 in order to provide an overall relative position. However, since the data from the segment position buffer 62 represents absolute data from the stator 20, it is not normally initialized when the cycle counter 60 is initialized. On the other hand, the data from the cycle counter 60 is always initialized each time the zero cycle on the rotor 22 is aligned with the zero position station so that cycle count errors caused by signal noise, etc., are eliminated each time the rotor 22 passes through an initialized position. Accordingly, the microcomputer 64 is operative for providing highly accurate position data to a host computer through the interface 72.

Figure 4:
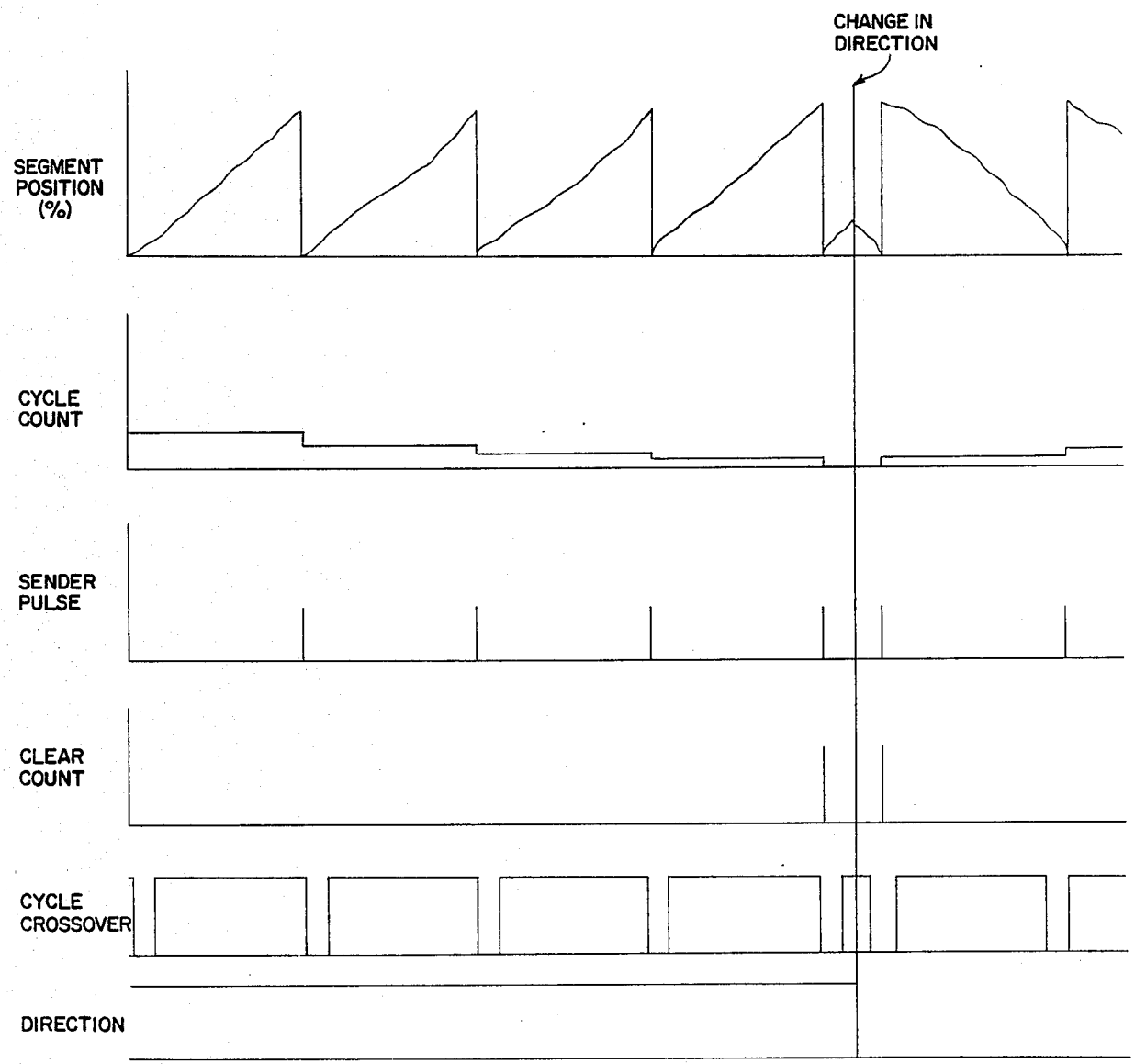
FIG. 4 is a timing diagram illustrating the operation of the system.

Referring now to FIG. 4, a timing diagram which illustrates the operation of the system 10 is shown. Proceeding from left to right, it will be seen that when the rotor 22 is rotated in a counterclockwise direction relative to the stator 20, the SEGMENT POSITION signal is gradually increased in value until the end of a cycle is reached, whereupon the SEGMENT POSITION signal is returned to a zero value. The cycle count is reduced as the zero cycle on the rotor 22 approaches the zero position station, and each time a cycle crossover occurs, a SENDER PULSE signal is emitted from the crossover shaper. When the cycle count reaches the zero cycle, the signal from the transmitter 26 is received by the receiver 28 so that a CLEAR COUNT signal is emitted from the sender-receiver circuit 34. Thereafter, when the direction of rotation of the rotor 22 is changed, a second CLEAR COUNT signal is emitted from the sender-receiver circuit 34 as the zero cycle on the rotor 22 passes through the zero cycle position, and the CYCLE COUNT is gradually increased.

Figure 1:
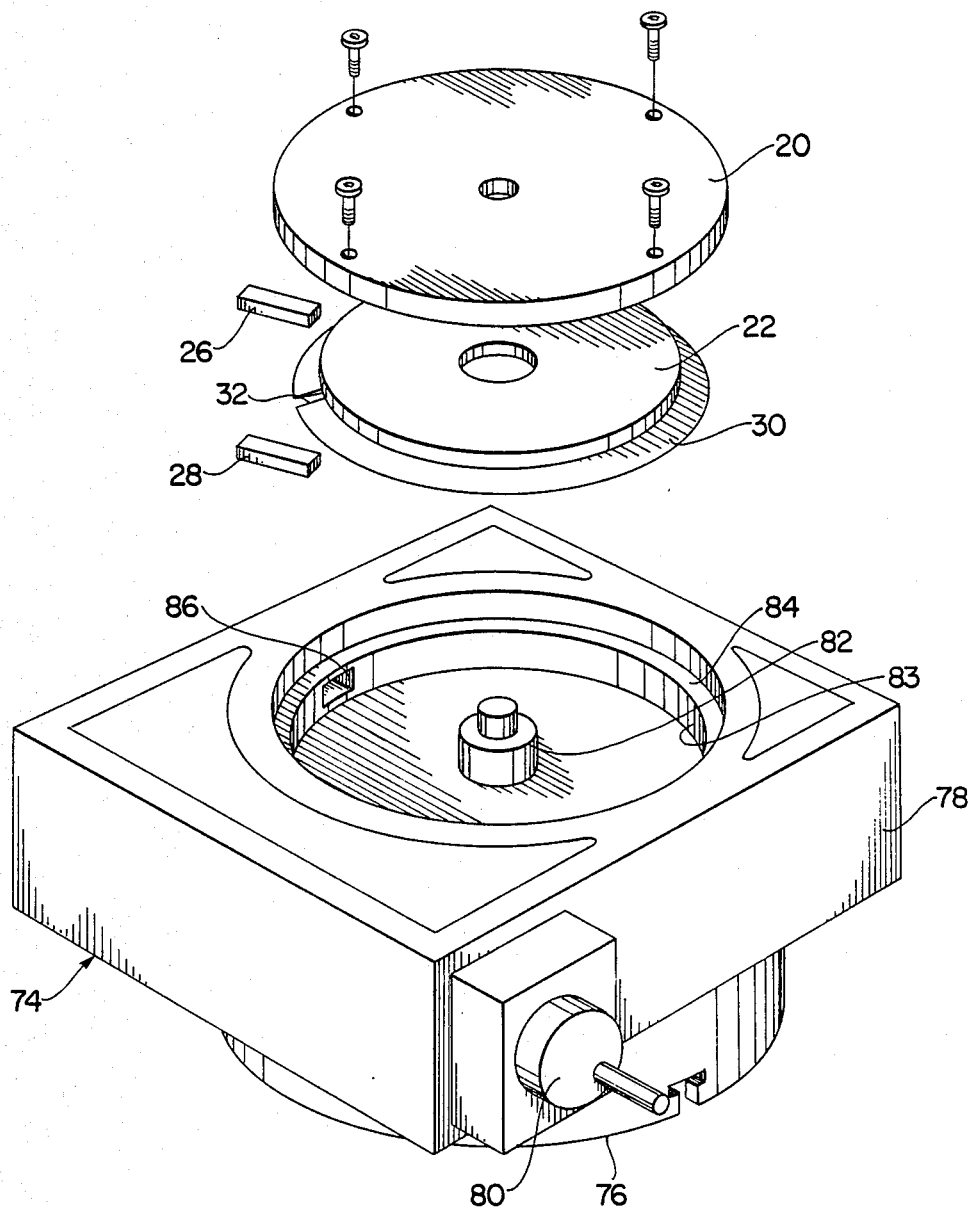
FIG. 1 is a perspective view of the rotary table of the instant invention in an inverted position.

Referring now to FIG. 1, a specific application of the system of the instant invention is illustrated in connection with a rotary table which is shown in an inverted disposition and generally indicated at 74. The rotary table 74 comprises a conventional rotary table which has been adapted to include the system 10. As will be seen, the rotary table 74 includes a face plate 76 which is mounted on a base 78, and a hand wheel 80. The rotary table 74 further comprises a stator 20 of the general type hereinabove set forth, a rotor 22, an interference plate 30 having a window 32 therein, a transmitter 26, and a receiver 28. The interference plate 30 is mounted on the rotor 22, and the rotor 22 is mounted on a rotor mount 82 so that it is positioned in an interior cavity in the base 78. The rotor mount 82 is adapted so that it rotates with the face plate 76, and accordingly, the rotor 22 and the interference plate 30 rotate with the face plate 76. The stator 20 is mounted on a shoulder 84 in the cavity 83 so that it is nonrotatable relative to the base 78, and the transmitter 26 and the receiver 28 are mounted in a housing 86 in the base 78. The rotary table 74 further comprises a sender-receiver circuit 34, a cycle conversion circuit 16, and a signal processing circuit 18, all of which are mounted in the base 78 and therefore not shown in FIG. 1. During operation of the rotary table 74, the position indication system 10 is operative for precisely determining the rotated position of the face plate 76 relative to the base 78 at any given time in the manner hereinabove set forth.

It is seen, therefore, that the instant invention provides an effective position indication system which is operative with a high degree of accuracy and repeatability for determining the relative positions of a pair of first and second members, such as first and second portions of a machining apparatus. The system 10 is operative for initializing the cycle count each time the system is oriented in an initialized position in order to correct errors in the cycle count caused by signal noise, etc. However, since the absolute segment position within a cycle is not updated or initialized with the cycle count, fractional position errors are not introduced into the segment position. Accordingly, for these reasons as well as the other reasons hereinabove set forth, it is seen that the system of the instant invention represents a significant advancement in the art which has substantial commercial merit.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. In a system for determining the relative positions of a pair of first and second members as said first member is moved in either a positive direction or a negative direction along a predetermined path of movement relative to said second member, said system comprising a cyclical position sensor including a first portion securable in effectively fixed relation to said first member and a second portion securable in effectively fixed relation to said second member, said first portion including cycle means for defining a uniform pattern of sequential cycles thereon and for generating a corresponding pattern of cycle signals therefrom, one of said cycles defining a zero cycle, each of said cycles being divided into a plurality of uniform segments, means defining a zero position station on said second portion, sequential cycles on said first portion sequentially passing adjacent said zero position station when said first and second portions are secured to said first and second members, respectively, and said first member is moved along said predetermined path relative to said second member, said system further comprising cycle position means responsive to said cycle means for determining the relative position between said first and second members within the cycle located adjacent the zero position station at any given time and summing means for determining the sum total of the number of cycles passing adjacent said zero position station in a positive direction minus the number of cycles passing adjacent said zero position station in a negative direction, the improvement comprising pulse means including pulse generating means and pulse sensing means, one of said pulse generating means or said pulse sensing means being effectively fixed with respect to said first portion, the other of said pulse generating means or said pulse sensing means being effectively fixed with respect to said second portion, said pulse generating means and said pulse sensing means cooperating to transmit and receive a pulse signal at at least one predetermined location when they are in a predetermined relative position, said predetermined relative position corresponding to a position wherein said zero cycle is aligned with said zero position station, and means responsive to said pulse sensing means for resetting said summing means to an initialized value without resetting said cycle position means each time said zero cycle is aligned with said zero position station.

2. In the system of claim 1, each of said pulse signals having a duration which causes it to extend over a distance corresponding to less than one cycle width and each being positioned so that it occurs entirely within a single cycle.

3. In the system of claim 1, said pulse generating means comprising a pulse generator, said pulse sensing means comprising a pulse receiver, said pulse generator and said pulse receiver being fixed relative to the same one of said first or second portions and being aligned relative to each other, one of said pulse generating means or said pulse sensing means further comprising selective interference means fixed relative to the other of said first or second portions and operative for selectively interfering between said pulse generator and said pulse receiver in order to only selectively transmit signals therebetween which correspond to a position wherein said zero cycle is aligned with said zero position station.

4. In the system of claim 1, said cyclical position sensor further characterized as a cyclical rotary position sensor.

5. In the system of claim 1, said cyclical position sensor further characterized as a cyclical induction position sensor.

6. In the system of claim 1, said pulse generating means and said pulse sensing means cooperating to transmit and receive pulse signals only when they are in a single predetermined relative position.

7. In the system of claim 6, said pulse generating means and said pulse sensing means cooperating to transmit and receive pulse signals only at a single location.

8. In the system of claim 7, said pulse generating means and said pulse sensing means cooperating to only transmit and receive a single pulse at said predetermined location when they are in said predetermined relative position.

9. In the system of claim 7, said pulse signals each having a duration which causes it to extend over a distance corresponding to less than one cycle width and each being timed so that it occurs entirely within a single cycle.

10. In the system of claim 2, each of said pulse signals having a duration which causes it to extend over a distance corresponding to the width of one segment.

11. In the system of claim 1, said pulse generating means further characterized as induction pulse generating means, said pulse sensing means further characterized as induction pulse sensing means, said pulse signals being of insufficient duration and intensity to saturate said pulse sensing means.

12. In the system of claim 3, said pulse generator producing a pulse signal each time a cycle passes by said zero position station, each pulse signal being located at the same relative position in the respective cycle thereof.

13. In a system for determining the relative positions of a pair of first and second members as said first member is moved in either a positive direction or a negative direction along a predetermined path of movement relative to said second member, said system comprising a cyclical resolver including first and second portions each having a predetermined uniform pattern of sequential cycles thereon, said first portion being securable in effectively fixed relation to said first member, said second portion being securable in effectively fixed relation to said second member, one of the cycles on said first portion defining a zero cycle, one of the cycles on said second portion defining a zero position station, sequential cycles on said first portion passing adjacent said zero position station when said first and second portions are secured to said first and second members, respectively, and said first member is moved along said predetermined path relative to said second member, said system further comprising cycle position means responsive to the cycles on said first and second portions for determining the relative segment positions between the cycles on said first portion and the cycles on said second portion at any given time and summing means for determining the sum total of the number of cycles passing adjacent said zero position station in a positive direction minus the number of cycles passing adjacent said zero position station in a negative direction, the improvement comprising encoded pulse generating means for generating an encoded pulse signal indicative of the position of said zero cycle relative to said zero position station and means responsive to said pulse generating means for resetting said summing means to an initialized value without resetting said cycle position means each time said zero cycle is aligned with said zero position station.

14. In the system of claim 13, said resolver further characterized as an induction resolver.

15. In a system for determining the relative positions of a pair of first and second members as said first member is moved in either a positive direction or a negative direction along a predetermined path of movement relative to said second member, said system comprising a cyclical position sensor including a first portion securable in effectively fixed relation to said first member and a second portion securable in effectively fixed relation to said second member, said first portion including cycle means for defining a uniform pattern of sequential cycles on said first portion and for generating a corresponding pattern of cycle signals therefrom, one of said cycles defining a zero cycle, each of said cycles being uniformly divided into a plurality of cycle segments, said second portion defining a zero position station, sequential cycles of said first portion sequentially passing adjacent said zero position station when said first and second portions are secured to said first and second members, respectively, and said first member is moved along said predetermined path relative to said second member, said system further comprising cycle position means responsive to said cycle means for determining the relative segment position within the cycle located adjacent the zero position station at any given time and summing means for determining the sum total of the number of cycles passing adjacent said zero position station in a positive direction minus the number of cycles passing adjacent said zero position station in a negative direction, the improvement comprising encoded pulse generating means for generating an encoded pulse signal indicative of the position of said zero cycle relative to said zero position station and means responsive to said pulse generating means for resetting said summing means to an initialized value without resetting the cycle position means each time said zero cycle is aligned with said zero position station.

16. In the system of claim 15, said resolver further characterized as an induction resolver.

* * * * *